United States Patent
Ng et al.

(10) Patent No.: US 6,941,488 B2
(45) Date of Patent: Sep. 6, 2005

(54) RETRIEVAL OF A SINGLE COMPLETE COPY FROM MULTIPLE STORED COPIES OF INFORMATION

(75) Inventors: TeckHock Ng, Singapore (SG); SweeKieong Choo, Singapore (SG); YongPeng Chng, Singapore (SG); Steven TianChye Cheok, Singapore (SG); Wesley WingHung Chan, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 668 days.

(21) Appl. No.: 09/893,262

(22) Filed: Jun. 27, 2001

(65) Prior Publication Data

US 2002/0032881 A1 Mar. 14, 2002

Related U.S. Application Data

(60) Provisional application No. 60/222,990, filed on Aug. 4, 2000.

(51) Int. Cl.[7] .............................................. G06F 11/00
(52) U.S. Cl. ........................................ 714/7; 369/30.05
(58) Field of Search ............................. 714/7, 5–6, 8, 714/15, 42, 54; 711/161, 162; 369/30.05, 30.19

(56) References Cited

U.S. PATENT DOCUMENTS

| | | | |
|---|---|---|---|
| 4,434,487 A | 2/1984 | Rubinson et al. ............. 371/10 |
| 5,235,585 A | * 8/1993 | Bish et al. ................ 369/53.17 |
| 5,283,791 A | 2/1994 | Halford ...................... 371/40.4 |
| 5,542,064 A | 7/1996 | Tanaka et al. ............... 395/441 |
| 5,701,304 A | 12/1997 | Glover et al. ............... 371/10.2 |
| 5,754,355 A | 5/1998 | Nakamura et al. ........ 360/73.03 |
| 5,768,502 A | 6/1998 | Ikushima et al. ....... 395/185.07 |
| 5,872,671 A | 2/1999 | Suzuki et al. .................. 360/75 |
| 6,061,824 A | 5/2000 | Mo et al. ..................... 714/769 |
| 6,101,619 A | * 8/2000 | Shin ............................ 714/710 |

* cited by examiner

*Primary Examiner*—Dieu-Minh Le
(74) *Attorney, Agent, or Firm*—Westman, Champlin & Kelly (57) ABSTRACT

A method and apparatus for retrieving a single complete copy from multiple stored copies is provided. Information of each of the multiple stored copies is contained in a different set of sectors on disc surfaces in a disc storage system. Each different set of sectors can include at least one defective sector from which information is not recoverable. One copy from the multiple stored copies from which information is recoverable is selected. Defective sectors in the selected copy are identified. Replacement sectors are located from the multiple stored copies other than the selected copy. Information from the selected copy is merged with information from the replacement sectors to form the single complete copy.

20 Claims, 10 Drawing Sheets

RETRIEVAL OF A SINGLE COMPLETE COPY FROM MULTIPLE STORED COPIES OF INFORMATION

CROSS-REFERENCE TO RELATED APPLICATION

This application claims priority to U.S. Provisional Patent Application No. 60/222,990, filed Aug. 4, 2000, and entitled "A ROBUST RESERVED CYLINDER INFORMATION RETRIEVAL METHOD".

FIELD OF THE INVENTION

The present invention relates to disc storage systems and, in particular, to a method and apparatus for retrieval of a single complete copy from multiple stored copies of information.

BACKGROUND OF THE INVENTION

In data storage systems such as disc drives, information is stored upon a surface of a medium such as a storage disc in a set of concentric circular patterns called tracks. Typically, storage discs of a disc drive are stacked and mounted for rotation together on a single spindle. Each side of each disc in the disc stack has a surface which is usually used to store information. Each surface of a disc in the disc stack is usually exposed to at least one head responsible for reading and writing information on that particular surface. Typically, all the heads which are mounted on an actuator arm move in tandem radially over the surfaces of the disc so that they are all at the same approximate disc radius at the same time.

In order to read and write data from the correct location in the disc stack, the data storage areas in the disc stack are identified by a cylinder address, head address and sector address. A cylinder identifies a set of specific tracks on the disc surfaces in the disc stack which lie at equal radii and are, in general, simultaneously accessible by the collection of heads. The head address identifies which head can read the data and therefore identifies the disc that the data is recorded on. Each track within a cylinder is further divided into sectors for storing data and servo information.

Most cylinders are available for read/write access by the host computer. However, drive unique information, for example, the drive defect table (table that contains remap information to circumvent defective sectors formed at the time the disc was manufactured) is stored in reserved cylinders which are not normally accessible by the host computer. Typically, multiple copies of drive unique information are stored in reserved cylinders. Additionally, multiple copies of user data are sometimes stored on user accessible cylinders for fast access and data backup purposes.

Each of the multiple copies is stored on a different set of sectors. Defects can arise in any of these sectors at various times during the lifetime of the storage system (grown defects). Grown defects include, for example, invading foreign particles which become embedded onto the surface of the disc, or external shocks to the storage system which can cause the transducer to nick the surface of the disc. Defective sectors present within a group of sectors storing any of the multiple copies of information pose either temporary or permanent problems in retrieving an entire copy.

In typical prior art systems, when retrieval of a first copy fails due to a defective sector being encountered, a second attempt is made to retrieve a second copy. If the second attempt fails, a third attempt is made to retrieve a third copy and so on. This process is repeated until, either a complete copy is retrieved or until a recovery attempt on the last available copy has failed. In this retrieval method, any portion of information contained on a defective sector in each copy is sufficient to prevent the retrieval of a complete copy of information. Therefore, at least one copy of information should be contained on a set of completely error-free sectors for the prior art retrieval method to work. Consequently, data can be lost, or in some cases, where critical information like the defect table cannot be retrieved, the drive could prevent the user from accessing any data stored on the discs.

In general, all data backup systems include redundant copies of information. One such system is the redundant array of inexpensive discs (RAID) system. In typical RAID systems, multiple copies of information are stored in data arrays with each copy stored on different drive. In some models of RAID systems, when a failure occurs in an array, subsequent read and write operations are directed to a surviving drive. A replacement drive is then rebuilt using data from the surviving drive. Thus, a surviving drive containing error-free data is needed for this technique.

Other models of RAID systems use parity information for data recovery. This technique involves regenerating missing data by determining the appropriate value of each missing bit. Typically, parity information is distributed among all drives in the array, instead of a dedicated parity drive to prevent loss of all parity information. However, loss of any drive still reduces the availability of both data and parity information until the failed drive is regenerated from a surviving drive.

The present invention addresses these problems, and offers other advantages over the prior art.

SUMMARY OF THE INVENTION

The present invention relates to disc storage systems capable of merging recoverable sectors (error free sectors) from more than one stored copy of information to form a single complete copy to solve the above-mentioned problems.

A method and apparatus for retrieving a single complete copy from multiple stored copies is provided. Information of each of the multiple stored copies is contained in a different set of sectors on disc surfaces in a disc storage system. Each different set of sectors includes at least one defective sector from which information is not recoverable. One copy from the multiple stored copies from which information is recoverable is selected. Defective sectors in the selected copy are identified. Replacement sectors are located from the multiple stored copies other than the selected copy. Information from the selected copy is merged with information from the replacement sectors to form the single complete copy.

These and various other features as well as advantages which characterize the present invention will be apparent upon reading of the following detailed description and review of the associated drawings.

DETAILED DESCRIPTION OF ILLUSTRATIVE EMBODIMENTS

Figure 1:
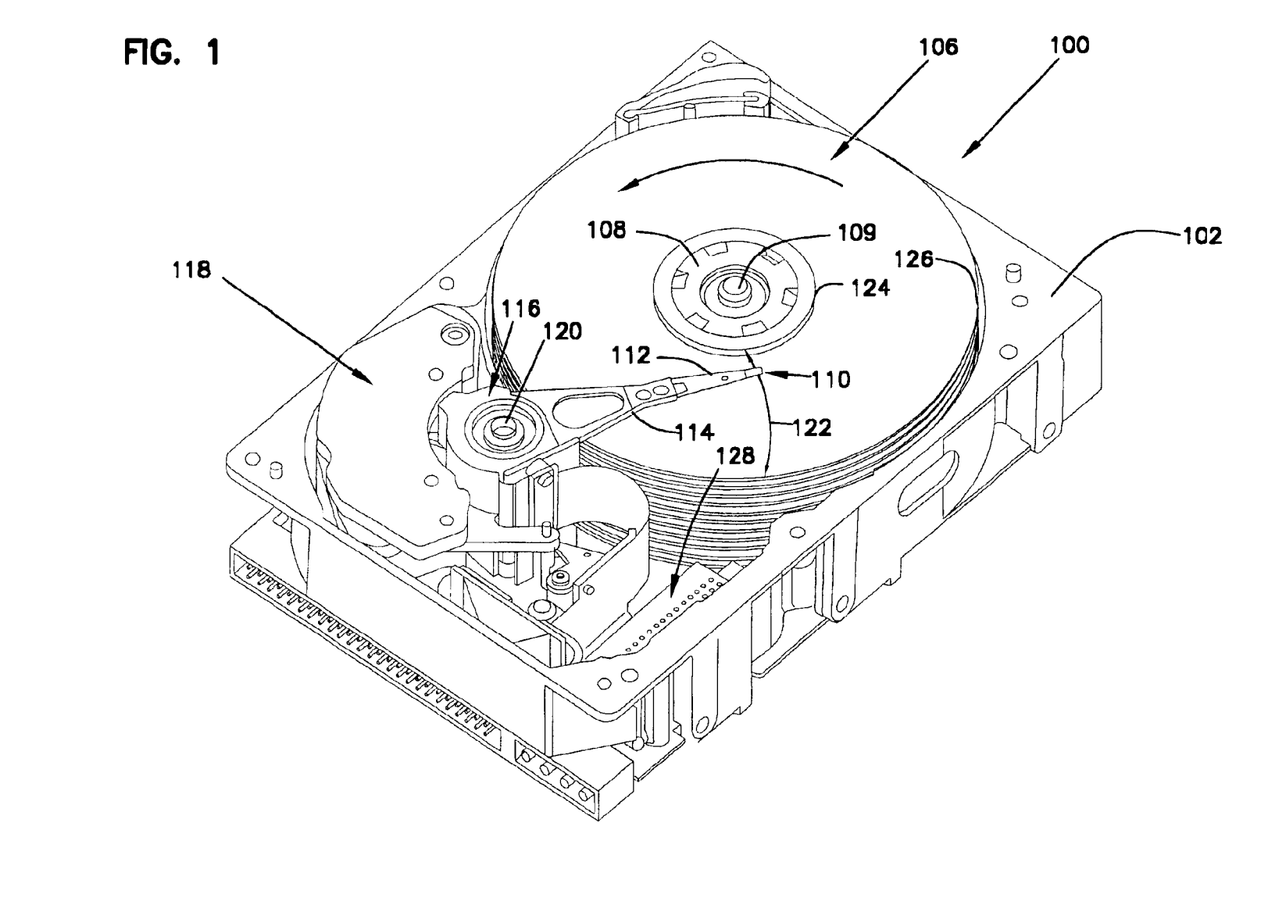
FIG. 1 is a perspective view of a head-disc assembly (HDA) with which the present invention is useful.

Referring now to FIG. 1, a perspective view of a disc drive, head disc assembly (HDA) 100 with which the present invention is useful is shown. The same reference numerals are used in the various figures to represent the same or similar elements. HDA 100 includes a housing with a base 102 and a top cover (not shown). HDA further includes a disc stack 106, which is mounted on a spindle motor (not shown) by a disc clamp 108. Disc stack 106 includes a plurality of individual discs which are mounted for co-rotation about central axis 109.

Each disc surface has an associated slider 110 which is mounted in HDA 100 and carries a read/write head for communication with the disc surface. In the example shown in FIG. 1, sliders 110 are supported by suspensions 112 which are in turn supported by track accessing arms 114 of an actuator 116. The actuator shown in FIG. 1 is of the type known as a rotary moving coil actuator and includes a voice coil motor (VCM), shown generally at 118. Other types of actuators can be used, such as linear actuators.

Voice coil motor 118 rotates actuator 116 with its attached sliders 110 about a pivot shaft 120 to position sliders 110 over a desired data track along a path 122 between a disc inner diameter 124 and a disc outer diameter 126. Voice coil motor 118 operates under the control of a closed-loop servo controller within internal circuitry 128 based on position information, which is stored on one or more of the disc surfaces within dedicated servo fields. The servo fields can be interleaved with data sectors on each disc surface or can be located on a single disc surface that is dedicated to storing servo information. As slider 110 passes over the servo fields, the read/write head generates a readback signal that identifies the location of the head relative to the center line of the desired track. Based on this location, actuator 116 moves suspension 112 to adjust the head's position so that it moves toward the desired position. Once the transducing head is appropriately positioned, servo controller 128 then executes a desired read or write operation.

Figure 2:
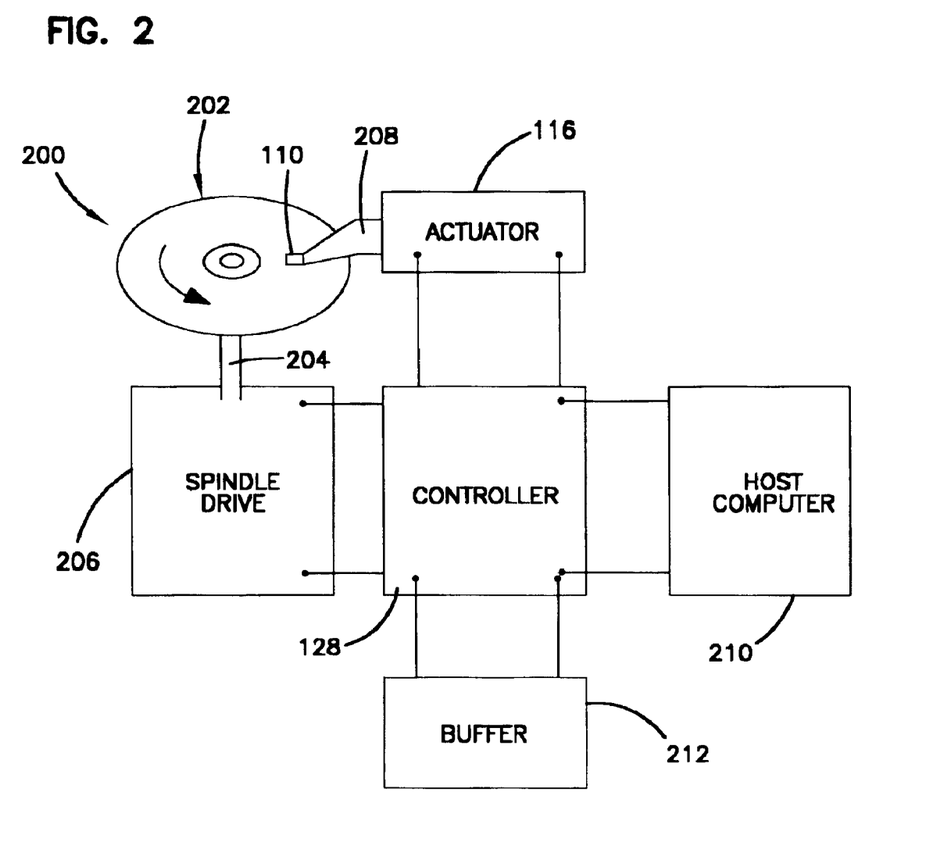
FIG. 2 is a simplified block diagram of a disc drive storage system in accordance with the present invention.

Referring now to FIG. 2, a simplified block diagram of a disc drive storage system 200 in accordance with the present invention is shown. For simplification, only one disc 202 of disc stack 106 (of FIG. 1) is shown. Spindle 204 connects disc 202 to spindle drive motor 206 which rotates disc 202 at high speed. Slider 110 that carries the read/write head is connected to actuator 116 through support arm 208. Controller 128 directs the action of actuator 116 which moves support arm 208. Host computer 210 is in communication with controller 128 which is adapted to receive commands from host 210 and operate the disc drive in accordance with these commands. When a read operation is sent from the host 210 to controller 128, the controller converts a logical block address received from the host 210 to a physical block address (PBA). Based on the PBA, a seek is performed and data is read from the disc into disc drive buffer memory 212. Typically, when a read error occurs, an error correction algorithm that attempts to identify and correct the error at the defective sector is applied by controller 128.

Critical information, such as the drive defect table, is stored on the disc 202 in multiple copies in reserved cylinders. One copy of the drive defect table is retrieved from the disc 202 into buffer memory when the disc 202 is booted up. Multiple copies of the drive defect table are stored on the disc 202 to ensure that at least one complete copy can be retrieved from the disc 202. Additionally, multiple copies of user data are sometimes stored on user accessible cylinders for fast access and data backup purposes. Although storing multiple copies of critical information increases the probability of recovering a complete copy, in some cases portions of information from each of the multiple copies may be contained on one or more defective sectors. The following is an example of a condition in which none of the copies are individually completely recoverable.

Figure 3:
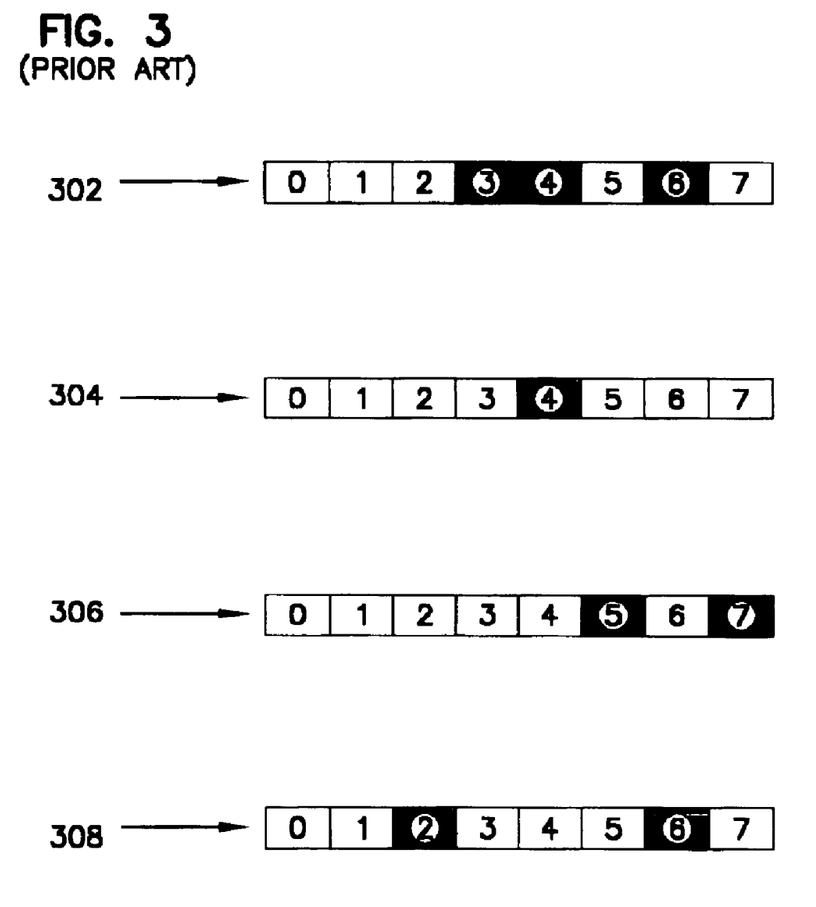
FIG. 3 illustrates an example of a prior art method of attempting to retrieve a single copy of information from multiple copies of a defect table.

Referring now to FIG. 3, an example of a prior art method of attempting to retrieve a single copy of defect table information from multiple copies is shown. Four copies of defect table information (302, 304, 306 and 308) with each having information stored over eight sectors with at least one of the eight sectors of each copy being defective are shown. Retrieval begins with an attempt to recover first copy 302. Sectors (0), (1) and (2) are successfully recovered, but an attempt to recover information from defective sector (3) of first copy 302 fails. As a result of this failed recovery attempt on sector (3) of the copy 302, the recovery attempt on copy 302 is terminated and a recovery attempt on second copy 304 is initiated. The first four sectors (0–3) of second copy 304 are error free and are therefore successfully recovered. However, sector (4) of second copy 304 is defective and the attempt to recover second copy 304 is terminated when defective sector (4) is encountered. An attempt to recover third copy 306 is then initiated. Sectors (0–4), which are error free, are successfully recovered, but the recovery attempt on third copy 306 is terminated when defective sector (5) is encountered. Finally, an attempt is made to recover fourth copy 308. Sectors (0–1) of fourth copy 308 are successfully recovered, but an error is encountered at sector (2) of fourth copy 308. After this failed read, the retrieval attempt is terminated and no further recovery attempts are made. Consequently, the defect table cannot be retrieved, thereby making the drive inaccessible.

Figure 4:
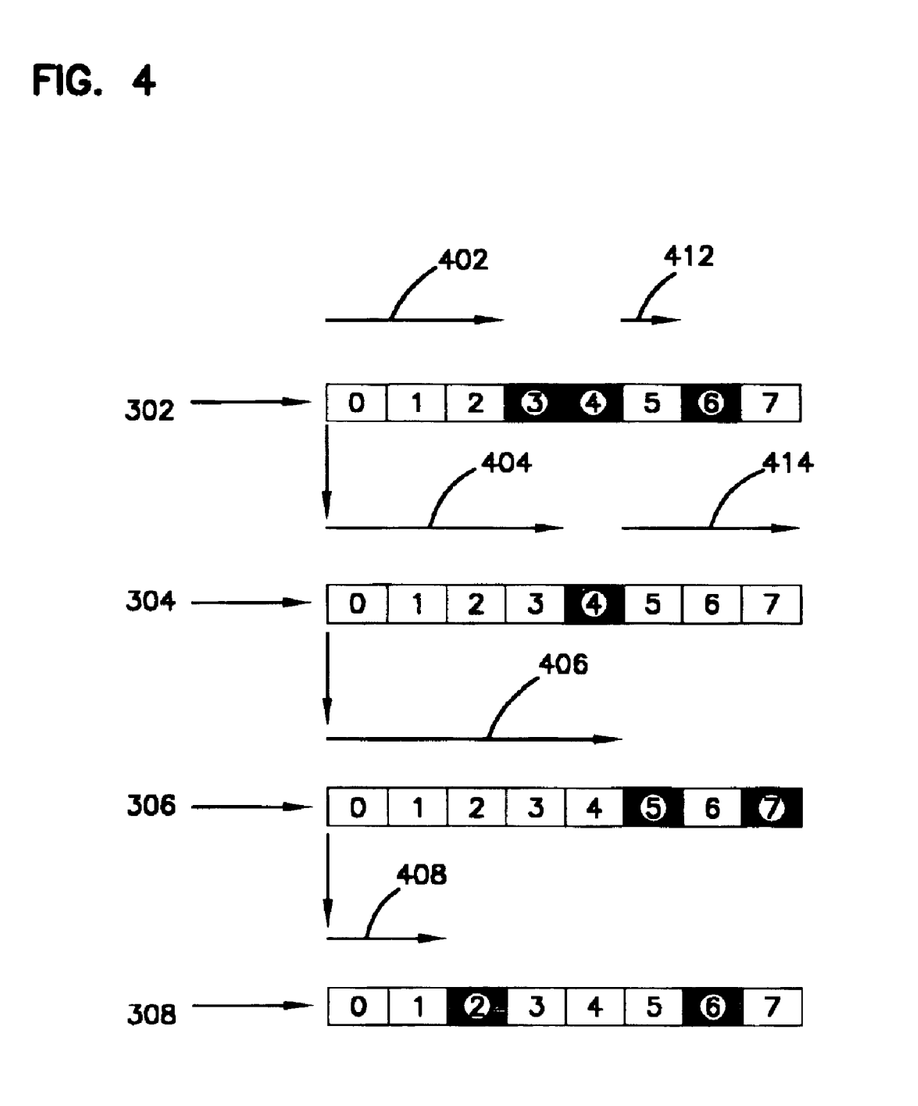
FIG. 4 illustrates retrieval of a single copy of information from multiple copies of a defect table in accordance with an embodiment of the present invention.

Referring now to FIG. 4, a re-illustration of the example shown in FIG. 3 using a new recovery method in accordance with an embodiment of the present invention is shown. The retrieval attempt begins with a read attempt 402 on first copy 302. On encountering defective sector (3), the number of error free sectors retrieved (0–2) is recorded. Next a read attempt 404 to read second copy 304 is initiated. Four error free sectors are read successfully from second copy 304 before a defective sector (4) is encountered. Again, the number of error free sectors read (0–3) are recorded followed by a third read attempt 406 to read third copy 306. Encountering the defective sector (5), the error-free sectors (0–4) are recorded. The process is repeated until an attempt to read all copies available is completed. In this example, a read attempt 408 is performed on fourth and last copy 308. After encountering defective sector (2) in read attempt 408, the number of error free sectors (0–1) are again recorded. The error free sectors from the copy with the longest sequence of error free sectors are then loaded into memory. In this example the sequence of five error free sectors (0–4) from copy 306 are the longest sequence of error free sectors and are therefore loaded into memory.

A second set of read attempts is then carried out to find error free sectors (5–7) to form a complete copy of the defect table. This operation begins with a second read attempt 412 on first copy 302 which is carried out starting at first subsequent error free sector (5). Sector (5) is retrieved successfully, but an error is encountered during the retrieval of sector (6) of first copy 302. Next, a second read attempt 414 on sectors (5–7) of second copy 304 is carried out. This attempt results in successful recovery of error free sectors (5–7) of second copy 304. Therefore, the retrieval process is terminated as all eight sectors have been successfully recovered to form a single complete copy. This retrieval method has enabled a copy of the defect table to be retrieved by merging information from the error free sectors from different stored copies when none of the copies are individually recoverable.

Figure 5:
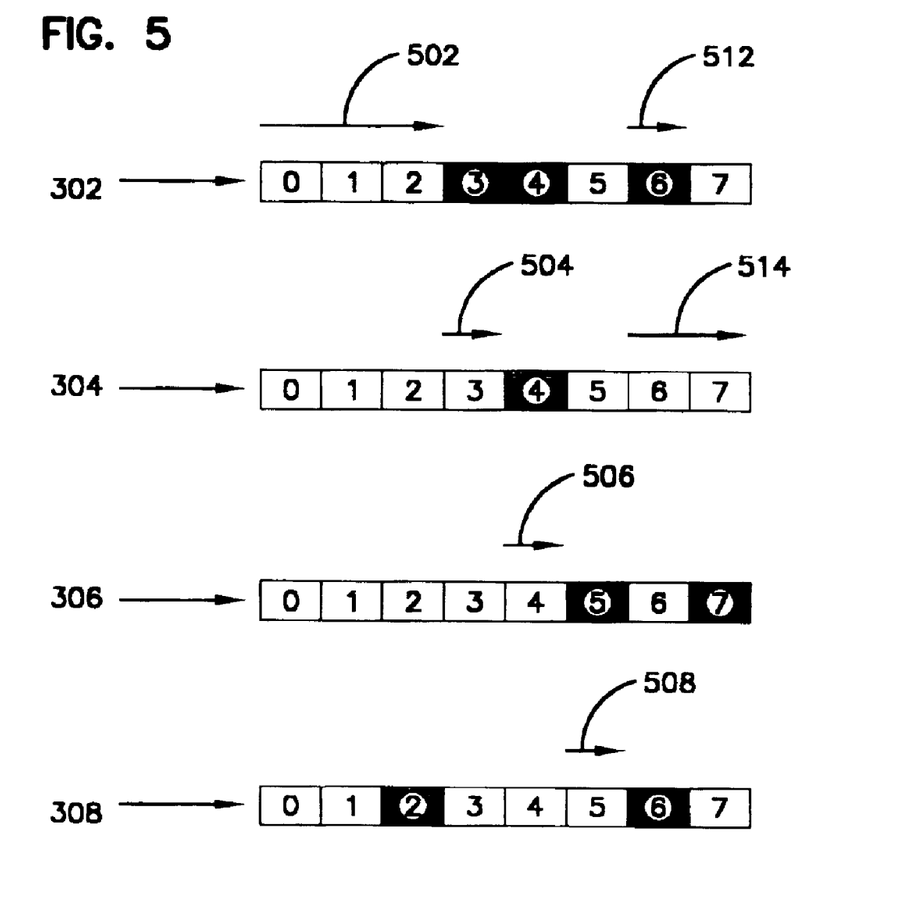
FIG. 5 illustrates retrieval of a single copy of information from multiple copies of a defect table in accordance with another embodiment of the present invention.

Referring now to FIG. 5, a recovery method in accordance with another embodiment of the present invention is shown. The retrieval attempt begins with a read attempt 502 on the first copy 302. After sectors (0–2) are retrieved, defective sector (3) is encountered. On encountering defective sector (3), read attempt 502 is terminated and defective sector (3) is recorded. Next a read attempt 504 to read second copy 304 is initiated. Read attempt 504 starts from the recorded defective sector (3) in read attempt 502. Sector (3) is recovered successfully, but an error is encountered during the retrieval of sector (4). On encountering defective sector (4), read attempt 504 is terminated and defective sector (4) is recorded. Read attempt 506, performed on copy 306, starts at last recorded defective sector (4). Sector (4) is recovered successfully, but an error is encountered during the retrieval of sector (5), which is recorded. Read attempt 508, performed on copy 308, starts at last recorded defective sector (5). After sector (5) is recovered successfully, an error is encountered during the retrieval of sector (6), which is recorded. Read attempt 508, performed on copy 308, is the last of a first set of read attempts performed on all copies of information. Since a single complete copy has not yet been successfully recovered, a second set of read attempts is carried out starting from sector (6) of copy 302. Sector (6) is the last recorded defective sector at the end of the first set of read attempts. Read attempt 512, performed on copy 302, starts at last recorded defective sector (6). Since sector (6) of copy 302 is defective, read attempt 512 is terminated and read attempt 514 is performed on copy 304 beginning at sector 6. This attempt results in successful recovery of sectors (6–7) of copy 304. Thus, the retrieval process is terminated as all eight sectors have been successfully recovered to form a single complete copy.

An unsuccessful termination of the retrieval process occurs if a defective sector encountered during a current read attempt on a particular copy is the same as a recorded defective sector from a previous read attempt on the same copy. In the above example, read attempt 502 on copy 302 results in sector (3) being the recorded defective sector. If, for example, sector (3) is also found defective on copies 304, 306 and 308 during read attempts 504, 506 and 508, respectively, then read attempt 512 will also begin on sector (3) of copy 302. If sector (3) is found defective during read attempt 512, the retrieval process terminates unsuccessfully.

Figure 6:
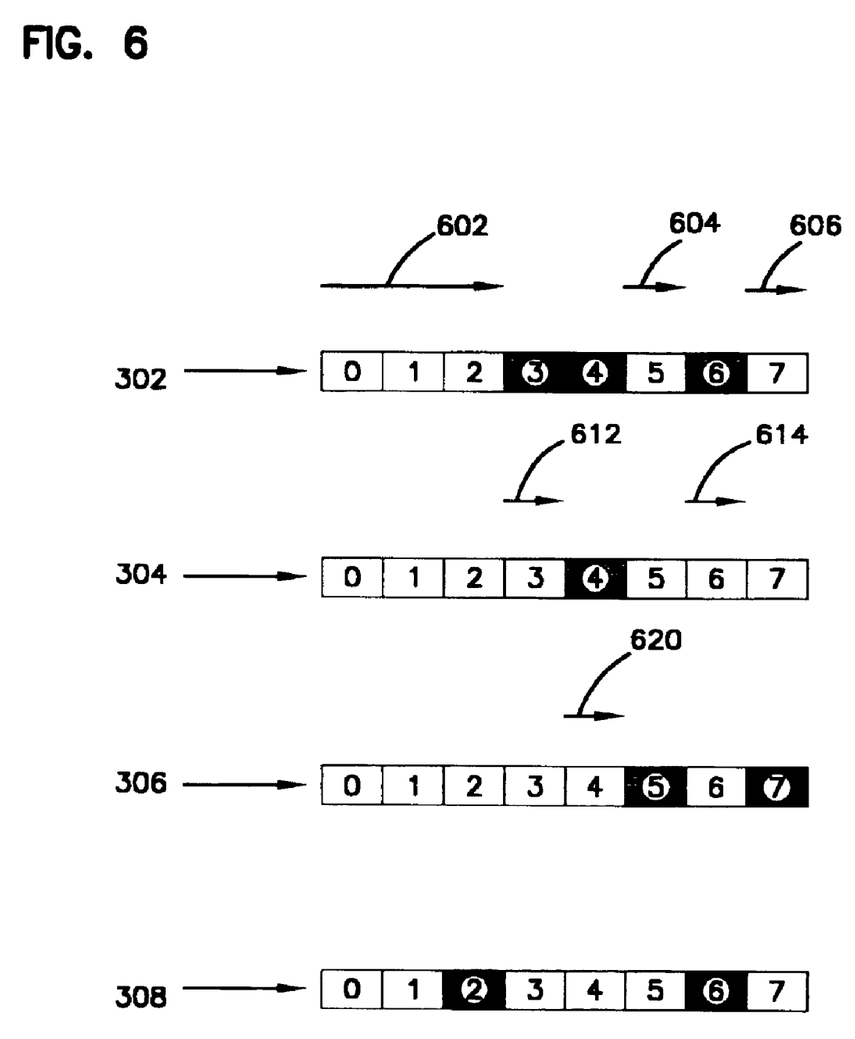
FIG. 6 illustrates retrieval of a single copy of information from multiple copies of a defect table in accordance with another embodiment of the present invention.

Referring now to FIG. 6, a recovery method in accordance with another embodiment of the present invention is shown. The retrieval attempt includes retrieving all error free sectors (0, 1, 2, 5, and 7) from copy 302 with the help of read attempts 602, 604 and 606, respectively. All defective sectors (3, 4 and 6) are recorded. Read attempt 612, performed on copy 304, begins at first recorded defective sector (3) which is successfully recovered, but terminates at defective sector (4). Read attempt 614, also performed on copy 304, begins at sector (6), which is successfully recovered. Final read attempt 620, performed on copy 306, begins at sector (4) which is successfully read. The retrieval process is terminated as all eight sectors have been successfully recovered to form a single complete copy. In general, the data recovery method of FIG. 6 includes retrieving information from all error free sectors of a first stored copy of data (such as 302), and recording all defective sectors of the first stored copy (such as 302). Next, a read attempt for recovery of defective sectors is carried out on a second stored copy (such as 304). The process is repeated on subsequent copies (such as 306, 308) until all defective sectors are recovered. The recovery attempt terminates unsuccessfully if a defective sector is encountered on a last stored copy of data (such as 308).

Although the above examples relate to recovery of a defect table, in general, the same retrieval process can be applied for recovery of a single complete copy from any set of multiple stored copies.

Figure 7:
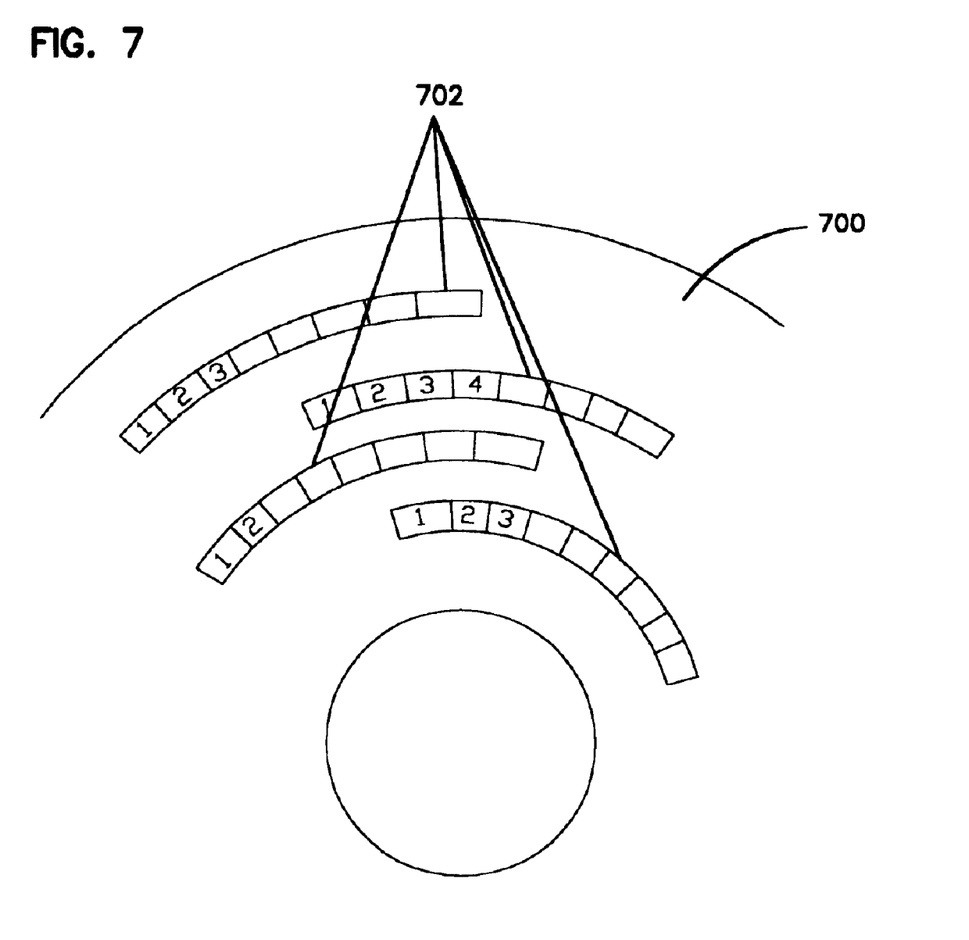
FIG. 7 shows multiple copies of all information contained on one disc surface.
Figure 8:
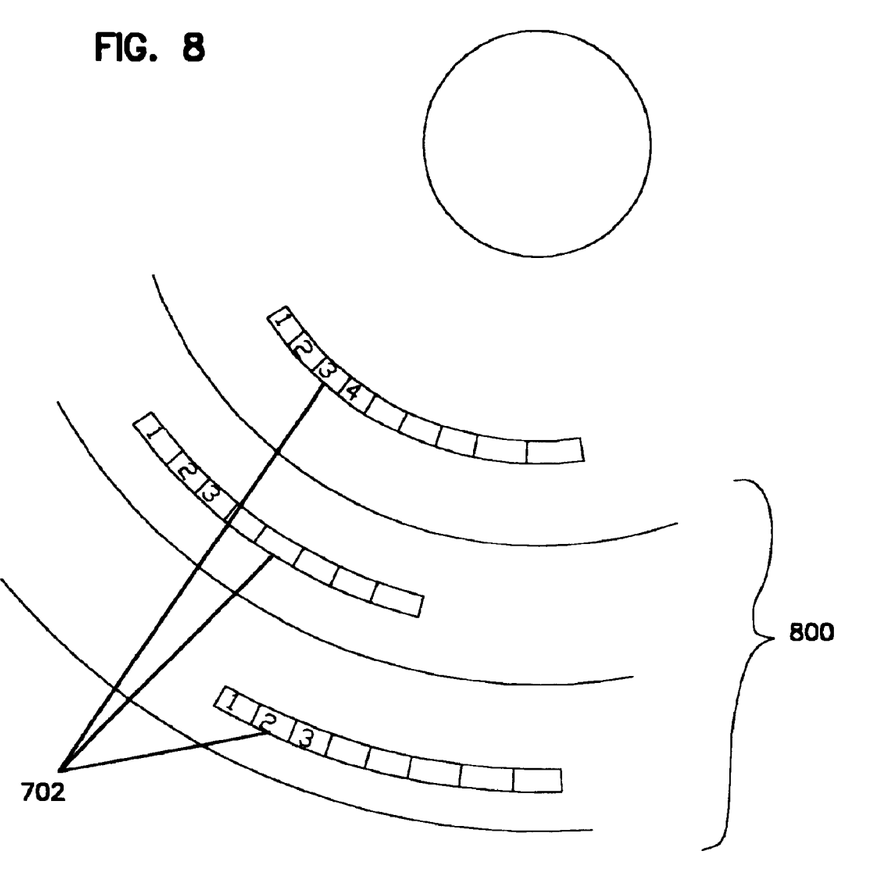
FIG. 8 shows individual copies of the multiple copies distributed on different disc surfaces.
Figure 9:
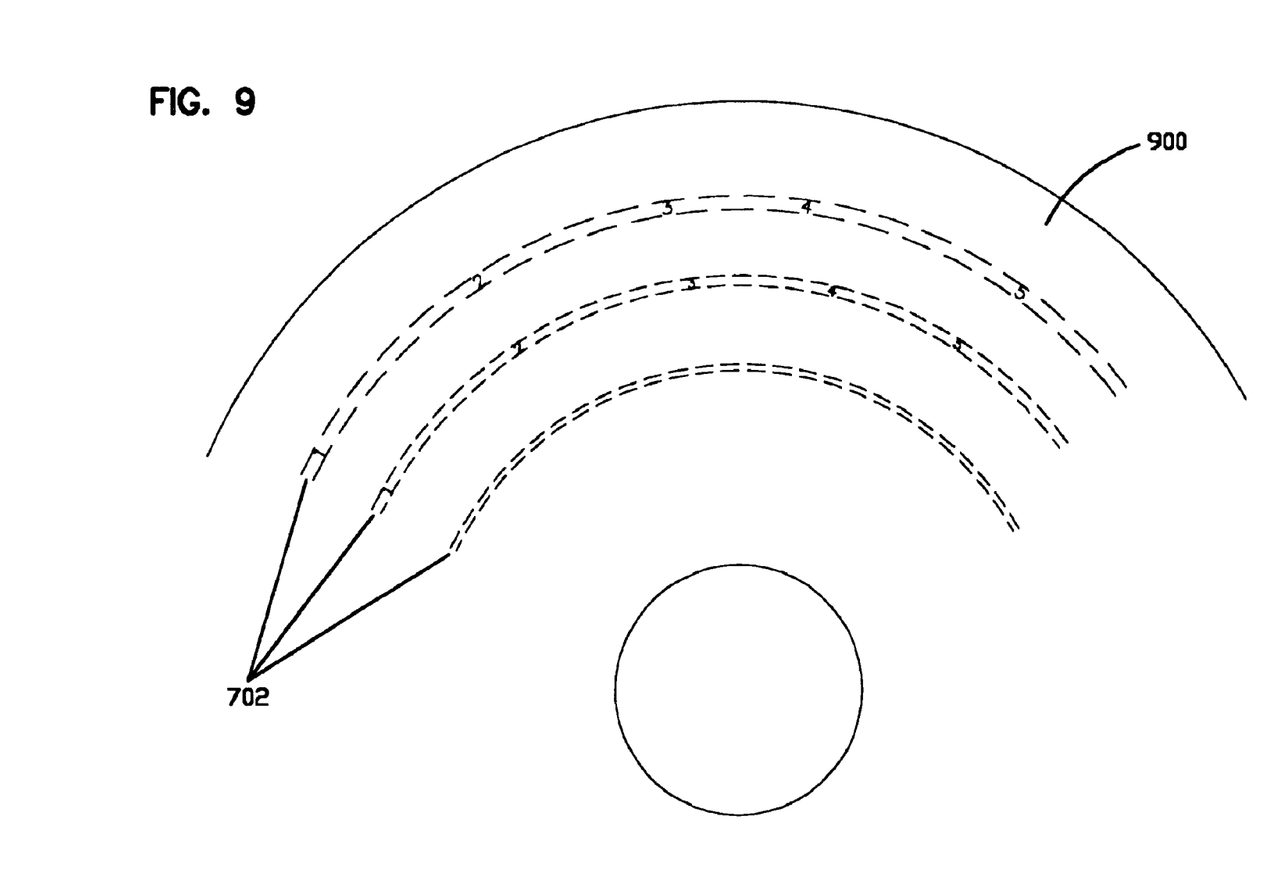
FIG. 9 shows sectors of individual copies of the multiple copies in an interleaved form.

FIGS. 7–9 illustrate different forms of storing multiple copies of information. FIG. 7 illustrates a form of storage where all multiple copies 702 are contained on one disc surface 700. In FIG. 8 a form of storage is shown where individual copies of the multiple copies 702 are each stored on a different disc surface of disc stack 800. FIG. 9 illustrates a sector interleave method of storage where consecutively numbered sectors are not laid next to each other in multiple copies 702 on disc surface 900. The new scheme for merging error free sectors from multiple stored copies can be applied in all the above forms of storing multiple copies of information.

Figure 10:
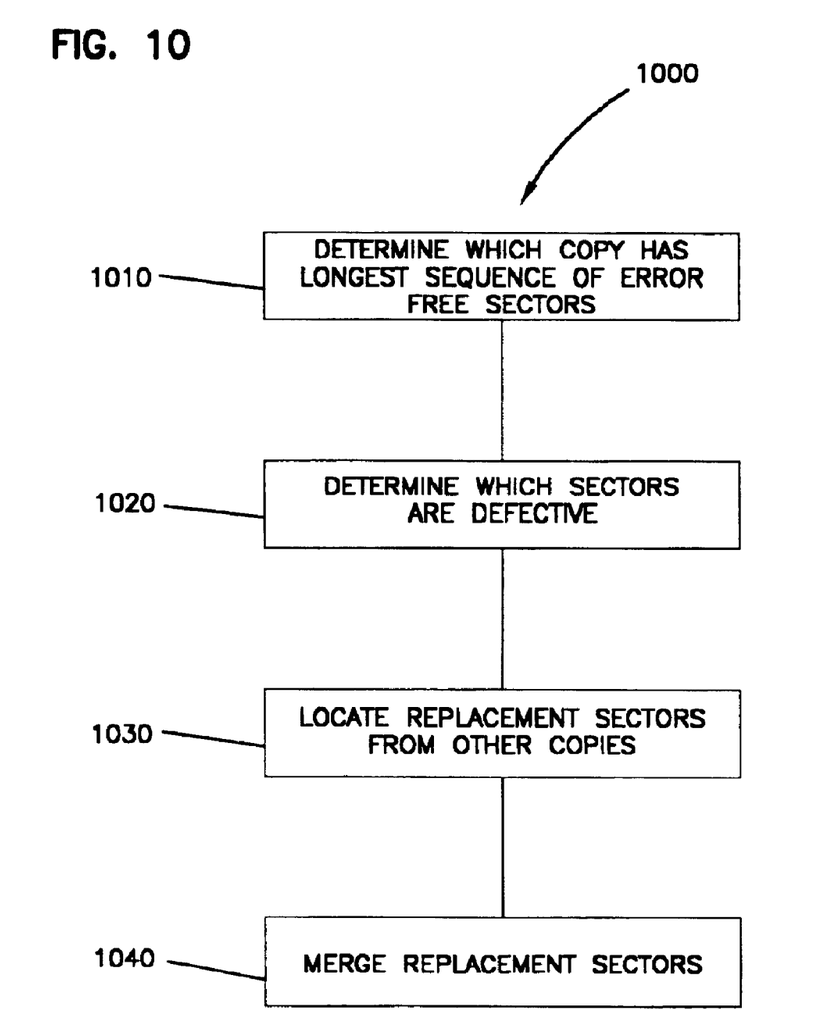
FIG. 10 shows a flow diagram of a method of retrieving a single complete copy from multiple stored copies in accordance with the present invention.

Referring now to FIG. 10, a flow diagram illustrating a method of merging information from the error free sectors from different stored copies to form a single complete copy in accordance with the present invention is shown. At block 1010 of FIG. 10, one copy having a longest sequence of error free sectors from which information is recoverable from multiple stored copies is selected. In block 1020, defective sectors in the copy having the longest sequence of error free sectors are identified. At block 1030, replacement sectors from multiple stored copies other than the copy having a longest sequence of error free sectors is located. At block 1040, information from the longest sequence of error free sectors is merged with information from the located replacement sectors to form a single complete copy.

The present invention can be summarized in reference to the figures, which illustrate (1) HDA 100 and components thereof, (2) block diagram of a disc drive storage system 200, and (3) examples of the new method of merging error free sectors from multiple copies. The method includes selecting one copy (302) from which information is recoverable from the multiple stored copies (302–308). Defective sectors are then identified in the selected copy (302). Replacement sectors from the multiple stored copies other than the selected copy are located to replace defective sectors. Information from the selected copy (302) is merged with information from the replacement sectors located to form the single complete copy.

In some embodiments, selecting one copy from multiple stored copies includes selecting a copy with the longest sequence of error free sectors (306). In some embodiments, selecting one copy with the longest sequence of error free sectors (306) includes sequentially reading each sector of the set of sectors from each one of the multiple stored copies (302–308). A number of error free sectors read before a first defective sector is encountered in each stored copy (402–408) is recorded. The copy having the longest sequence of error free sectors (306) from the recorded number of error free sectors corresponding to each copy of the multiple stored copies is then identified.

In some embodiments, locating replacement sectors is performed by selectively reading the set of sectors of at least one of the multiple stored copies other than the copy having a longest sequence of error free sectors (306). The selective reading is restricted to sectors within the set of sectors that can replace defective sectors.

In some embodiments of the present invention, information from the error free sectors is merged in a buffer memory 212. In some embodiments, the multiple stored copies 702 are all contained on one disc surface 700. In some embodiments, individual copies of the multiple stored copies 702 are distributed on different discs 800. In some embodiments, individual copies of the multiple stored copies 702 are interleaved with each other.

Embodiments of the present invention also include a disc drive storage system with at least one rotatable disc 202 having a disc surface including multiple stored copies (302–308) of information. Information of each of the multiple stored copies is contained in a different set of sectors on the disc surface. Each different set of sectors includes at least one defective sector from which information is not recoverable. Transducer head 110 is configured to read from the disc surface. Controller 128 selects one copy (302) from which information is recoverable from the multiple stored copies (302–308). Controller 128 also identifies defective sectors in the selected copy (302). Replacement sectors from the multiple stored copies other than the selected copy are located by controller 128. Finally, controller 128 merges information from the selected sectors with information from the replacement sectors located to form a single complete copy.

In some embodiments, controller 128 selects one copy of the multiple stored copies having a longest sequence of error free sectors (306). In some embodiments, controller 128 sequentially reads each sector of the set of sectors from each of the multiple stored copies. During the sequential read, controller 128 records a number of error free sectors read before a first defective sector is encountered in each copy. Controller 128 then identifies the copy having the longest sequence of error free sectors from the recorded number of error free sectors corresponding to each copy of the multiple stored copies.

In some embodiments, controller 128 selectively reads the set of sectors of at least one the multiple stored copies other than the copy having a longest sequence of error free sectors to locate replacement sectors. In some embodiments of the present invention, information from the error free sectors is merged in a buffer memory 212 by controller 128.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the disc retrieval operation while maintaining substantially the same functionality without departing from the scope and spirit of the present invention. Also, although the preferred embodiment discloses determining the longest sequence of error free sectors beginning at sector (0), equivalent alternative embodiments are contemplated wherein the longest sequence of error free sectors is determined beginning at any desired sector or regardless of where the sequence begins. In addition, although the preferred embodiment described herein is directed to retrieving a single copy complete copy of information from multiple copies of the same information for a disc storage system, it will be appreciated by those skilled in the art that the teachings of the present invention can be applied to systems, like magnetic, optical or other storage system techniques, without departing from the scope and spirit of the present invention.

What is claimed is:

1. A method of retrieving a complete copy of data from a plurality of stored copies of the data, the plurality of stored copies contained in a different set of storage locations in a data storage system, the method comprising:
   (a) selecting one of the copies from the plurality of stored copies;
   (b) identifying defective storage locations in the selected copy;
   (c) locating replacement storage locations from the plurality of stored copies other than the selected copy; and
   (d) merging storage locations from the selected copy with replacement storage locations defining the complete copy of substantially error free storage locations.

2. The method of claim 1 wherein step (a) includes selecting one of the copies from the plurality of stored copies having a longest sequence of error free storage locations.

3. The method of claim 1 wherein each of the plurality of stored copies of data comprises at least one defective storage location from which data is not recoverable.

4. The method of claim 1, wherein the selecting one copy step (a) comprises:
   (a)(1) sequentially reading each storage location of the set of storage locations from each of the plurality of stored copies;
   (a)(2) recording a number of error free storage locations read before a first defective storage location is encountered when each of the plurality of copies is sequentially read in accordance with step (a)(1); and
   (a)(3) identifying one copy having a longest sequence of error free storage locations from the recorded number of error free storage locations corresponding to each copy of the plurality of stored copies.

5. The method of claim 1, wherein the locating replacement storage locations step (c) is performed by locating the set of storage locations of at least one of the plurality of stored copies other than the selected copy, wherein the locating is restricted to reading storage locations within the set of storage locations that can replace defective storage locations identified in step (b).

6. The method of claim 1, wherein the merging storage locations step (d) is performed in a buffer memory.

7. The method of claim 1, wherein the plurality of stored copies is all contained on one disc surface.

8. The method of claim 1, wherein individual copies of the plurality of stored copies are distributed on different disc surfaces.

9. The method of claim 1, wherein individual copies of the plurality of stored copies are interleaved.

10. A disc drive storage system implementing the method of claim 1.

11. A data storage system, comprising:
- at least one storage medium having a plurality of stored copies of information, with information of each of the plurality of stored copies contained in a different set of storage locations; and
- a controller configured to select one copy of the plurality of stored copies, and to identify defective storage locations in the selected copy, and to locate replacement storage locations from the other stored copies, and to merge storage locations from the selected copy with the replacement storage locations defining a complete copy, of substantially error free storage locations, of the stored information.

12. The data storage system of claim 11 wherein the controller is further adapted to select one copy of the plurality of stored copies having a longest sequence of error free storage locations.

13. The data storage system of claim 11 wherein each of the plurality of stored copies of information comprises at least one defective storage location from which data is not recoverable.

14. The data storage system of claim 11, wherein the controller is further adapted to sequentially read each storage location from each of the plurality of stored copies, and to record a number of error free storage locations read before a first defective storage location is encountered when each of the plurality of stored copies is read, and to identify the copy having a longest sequence of error free storage locations from the recorded number of error free storage locations corresponding to each copy of the plurality of stored copies.

15. The data storage system of claim 11, wherein the controller is further adapted to selectively read the set of storage locations of at least one of the plurality of stored copies other than the copy having a longest sequence of error free storage locations.

16. The data storage system of claim 11, further comprising a buffer memory to temporarily store the complete copy.

17. The data storage system of claim 11, wherein the plurality of stored copies is contained on one data storage medium.

18. The data storage system of claim 11, wherein individual copies of the plurality of stored copies are distributed on different data storage media.

19. The data storage system of claim 11, wherein individual copies of the plurality of stored copies are interleaved.

20. A data storage system, comprising:
- at least one storage medium having a plurality of stored copies of information, with information of each of the plurality of stored copies contained in a different set of storage locations; and
- a controller means for selecting one copy of the plurality of stored copies from which information is recoverable, and for identifying defective storage locations in the selected copy, and for locating replacement storage locations from the other stored copies, and for merging storage locations from the selected copy with the replacement storage locations defining a complete copy, of substantially error free storage locations, of the stored information.

* * * * *